United States Patent [19]

Andrus et al.

[11] Patent Number: 6,164,515
[45] Date of Patent: Dec. 26, 2000

[54] MOVABLE SELECTIVE DEBRIDGING APPARATUS AND METHOD OF DEBRIDGING SOLDERED JOINTS ON PRINTED CIRCUIT BOARDS USING SAME

[75] Inventors: James J. Andrus, Bow; Allan Lance Larrabee, Litchfield; John Norton, New Boston, all of N.H.; Lambertus P. Willemen, Dorst, Netherlands

[73] Assignee: Soltec B.V., Oosterhout, Netherlands

[21] Appl. No.: 09/024,086

[22] Filed: Feb. 17, 1998

[51] Int. Cl.$^7$ .............................. B23K 1/08; B23K 31/02
[52] U.S. Cl. ............................ 228/20.1; 228/37; 228/260
[58] Field of Search ................... 228/260, 264, 228/20.1, 20.5, 37, 180.1

[56] References Cited

U.S. PATENT DOCUMENTS

| | | | |
|---|---|---|---|
| 4,451,000 | 5/1984 | Stephens | 228/20 |
| 4,566,624 | 1/1986 | Comerford | 228/180.1 |
| 4,600,137 | 7/1986 | Comerford | 228/102 |
| 4,659,004 | 4/1987 | Fridman | 228/6.2 |
| 4,664,308 | 5/1987 | Boynton | 228/180.1 |
| 4,679,720 | 7/1987 | Sedrick, Jr. et al. | 228/20 |
| 4,779,786 | 10/1988 | Holdway | 228/20 |
| 4,877,175 | 10/1989 | Jones et al. | 228/102 |
| 4,995,411 | 2/1991 | Lowell et al. | 134/198 |
| 5,228,614 | 7/1993 | Elliot et al. | 228/37 |
| 5,240,169 | 8/1993 | Gileta | 228/180.1 |
| 5,593,499 | 1/1997 | Stans et al. | 118/63 |

FOREIGN PATENT DOCUMENTS

WO 99/41036   8/1999   WIPO .............. B23K 3/06

OTHER PUBLICATIONS

Recent Developments in Automatic Component Lead Trimming Methods and Materials and "GBS"—A New Concept in Wave Soldering—K.G. Boynton, Hollis Engineering Inc., Nashua, New Hampshire (13 pp.).

International Preliminary Examining Authority, PCT Written Opinion, Nov. 16, 1999.

International Preliminary Examination Report, Apr. 20, 2000.

*Primary Examiner*—Patrick Ryan
*Assistant Examiner*—Kiley Stoner
*Attorney, Agent, or Firm*—Orrick, Herrington & Sutcliffe, LLP

[57] ABSTRACT

A debridging tool incorporated into an automated wave soldering system adjacent to and after a wave soldering station removes bridges and/or excess solder formed during the wave soldering process by emitting a pressurized stream of air, inert gas or other fluid only under selected areas of a printed circuit board, including a flexible circuit. The debridging tool, which comprises a movable nozzle from which the stream is emitted and a means for transporting the nozzle under the printed circuit board, targets only those areas of the board where bridges or excess solder repeatedly forms during the soldering process without disturbing solder joints where no bridges or excess solder form. More than one movable nozzle may be used where warranted. Since the debridging tool is positioned so closely to the wave soldering station and the latent heat from the soldering process remains in the printed circuit board, and the gas mass is relatively small, the stream of air, gas or other fluid used for solder removal may be kept below the temperature of molten solder. The debridging tool also permits the stream to be emitted at a first pressure under a first area where solder is to be removed and at a second pressure under a second area where solder is to be removed.

29 Claims, 16 Drawing Sheets

Microfiche Appendix Included
(3 Microfiche, 247 Pages)

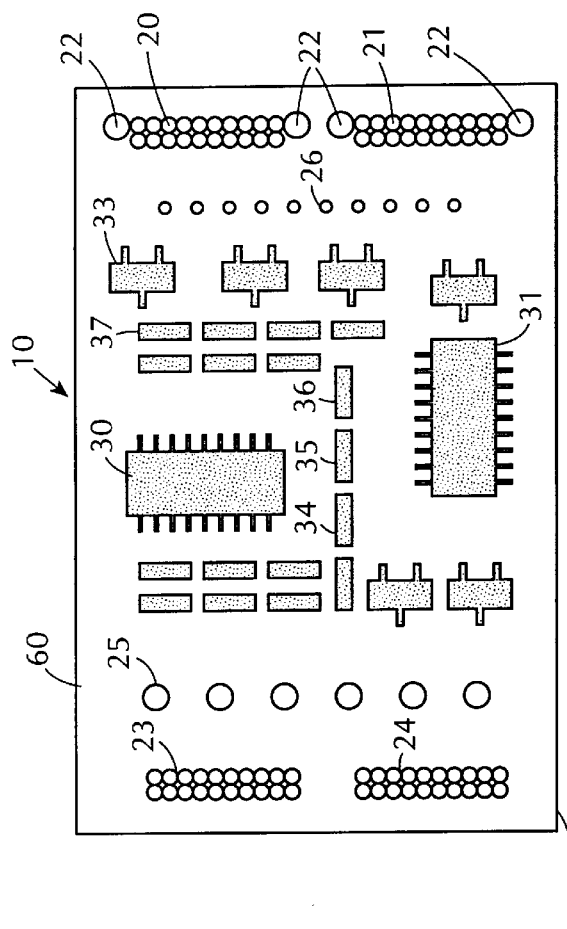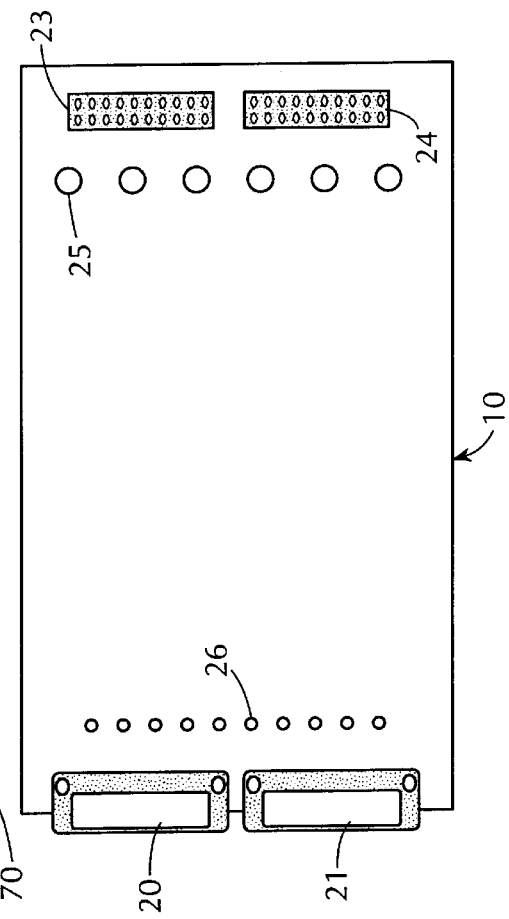

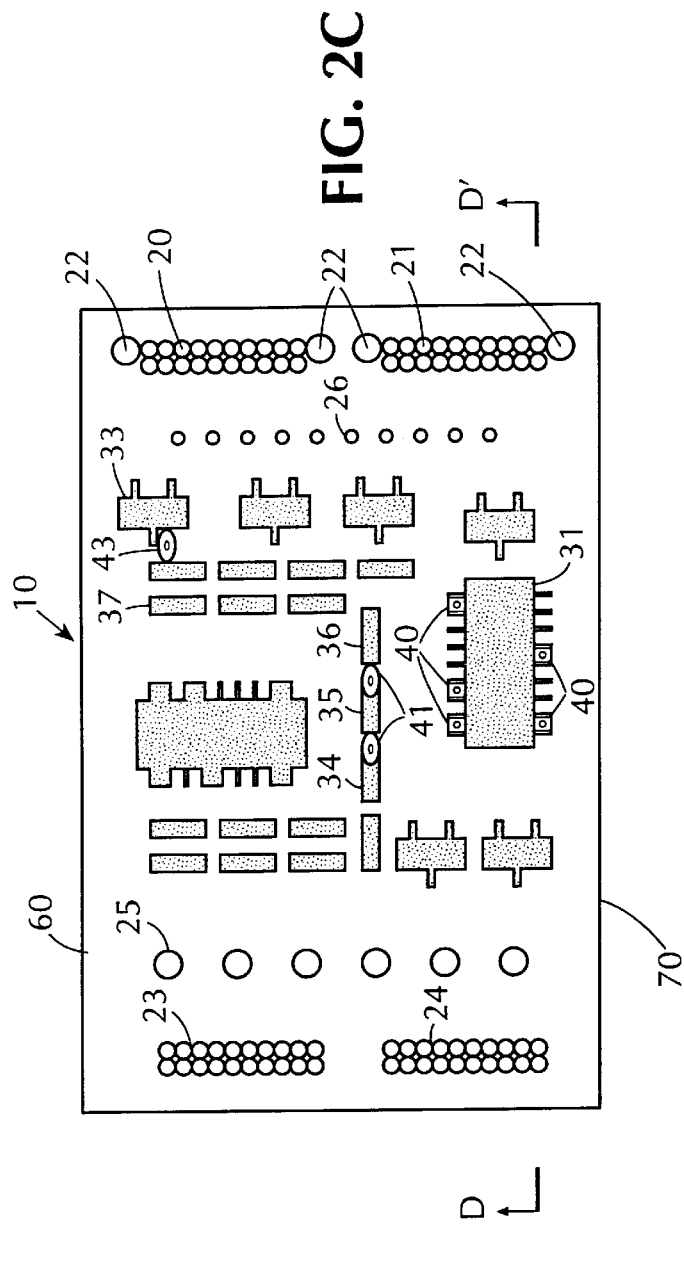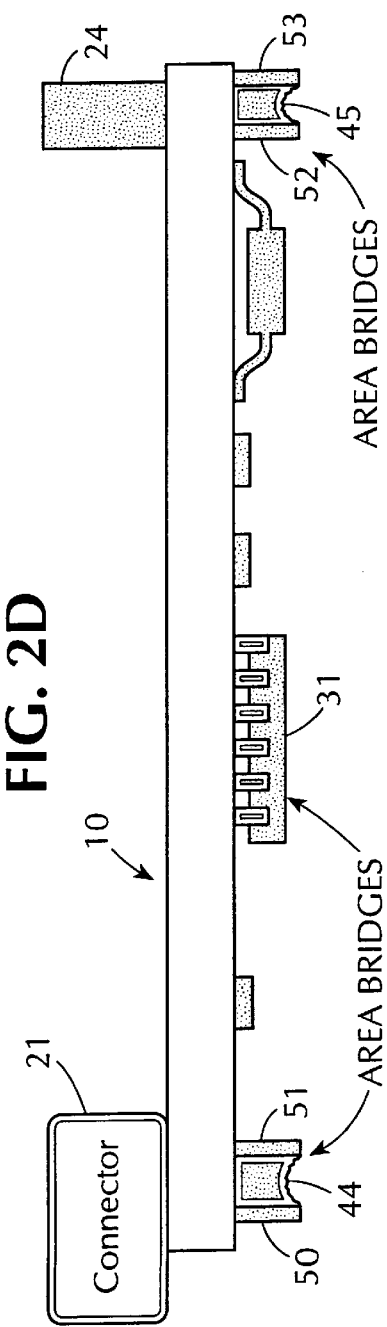

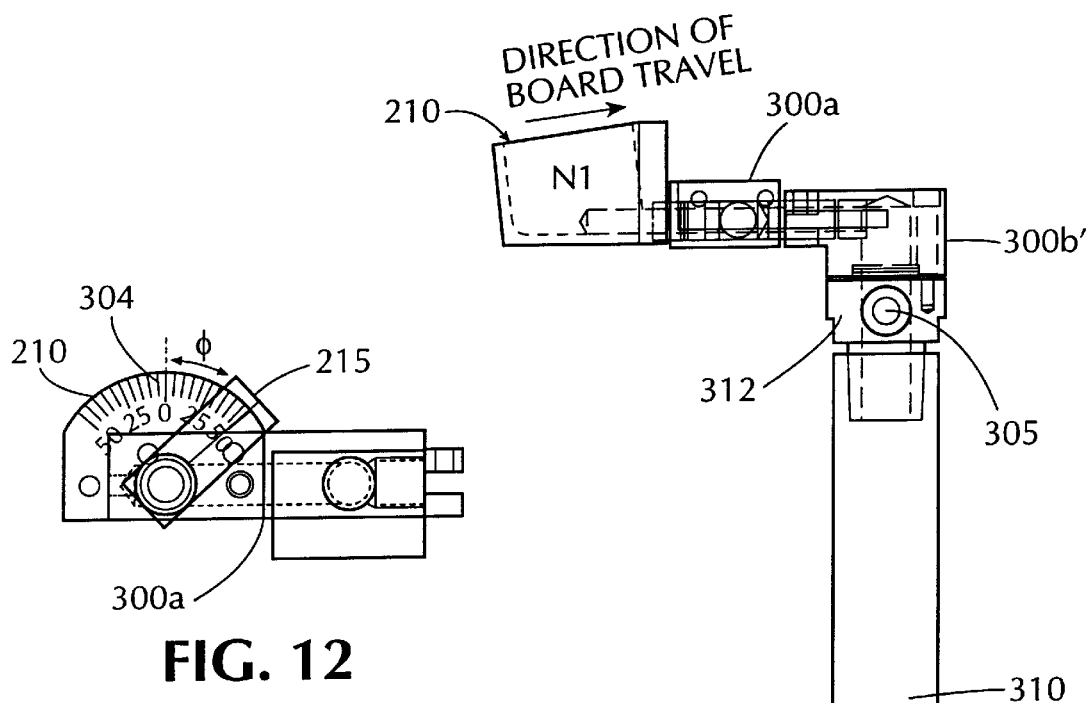
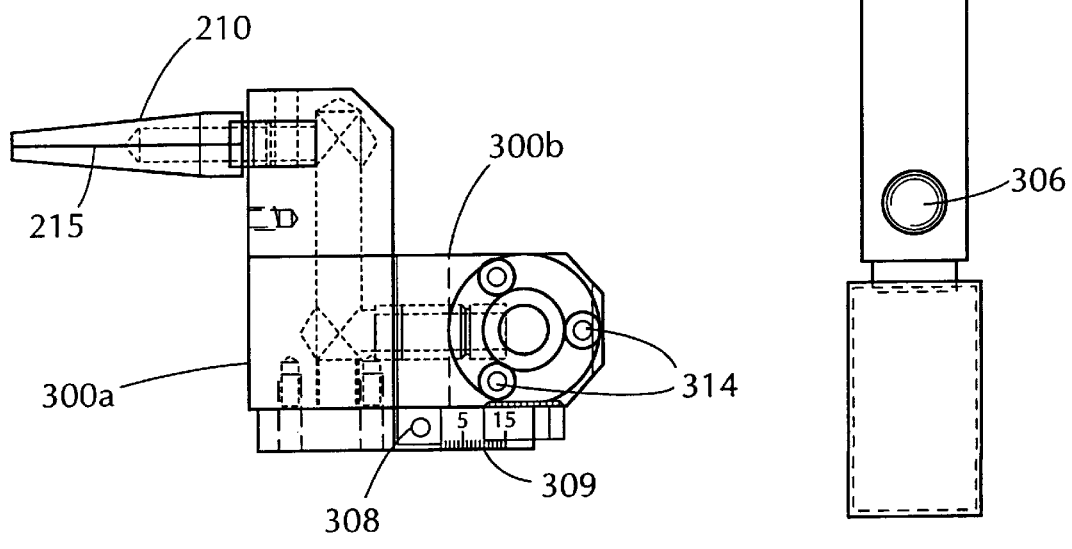
FIG. 12
FIG. 10                FIG. 11

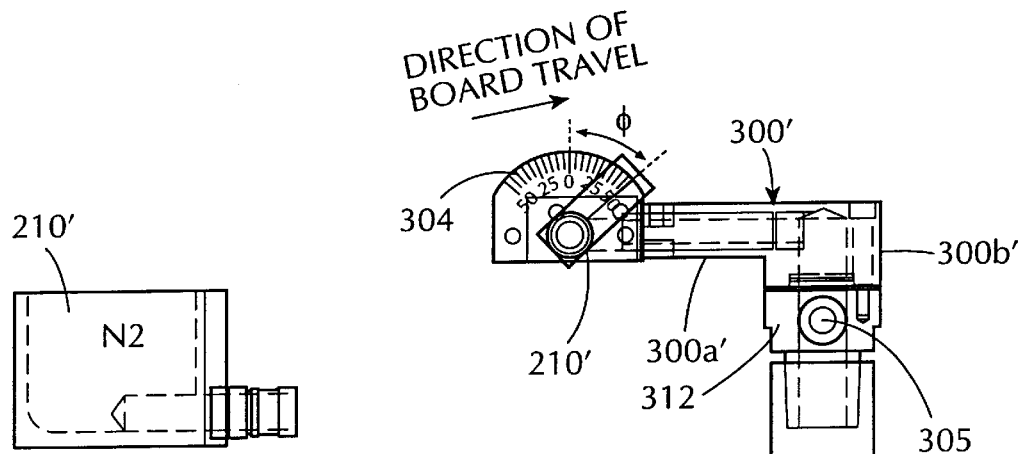
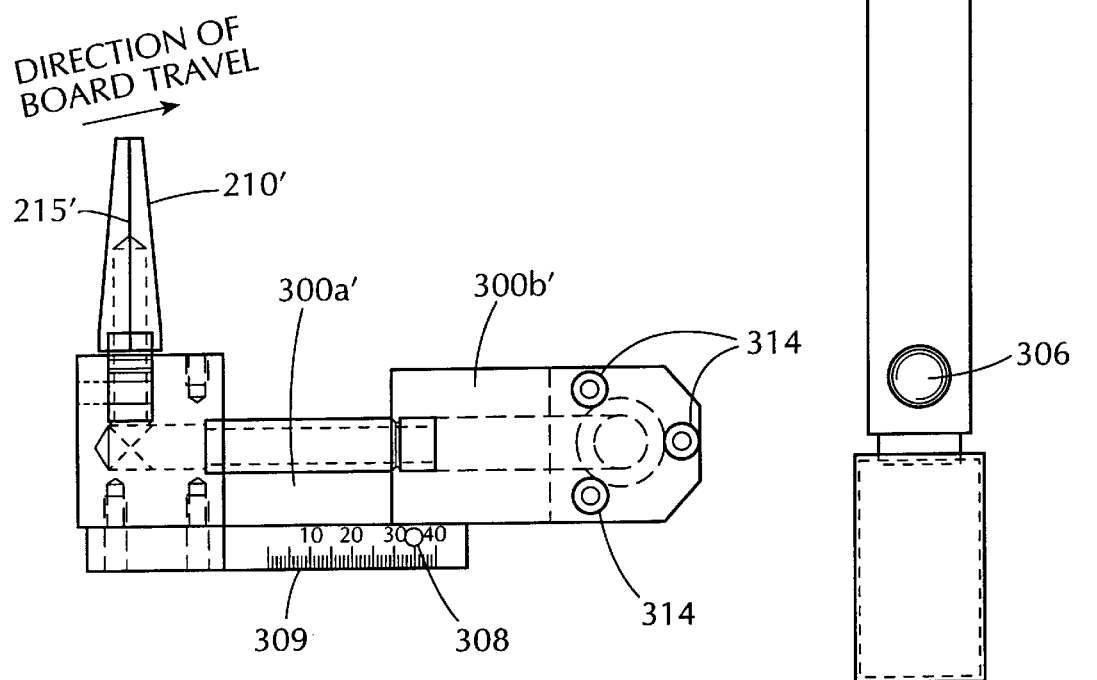
FIG. 13
FIG. 14
FIG. 15

MOVABLE SELECTIVE DEBRIDGING APPARATUS AND METHOD OF DEBRIDGING SOLDERED JOINTS ON PRINTED CIRCUIT BOARDS USING SAME

FIELD OF THE INVENTION

This invention relates to a method and apparatus for removing bridges and excess solder formed between or on soldered joints during an automated soldering process of electronic components so as to remove the bridges and excess solder without harming solder joints on the circuit board. The method and apparatus involve applying heated compressed air or an inert gas to selected portions of the printed circuit boards and flexible circuits after soldering.

MICROFICHE APPENDIX

A Microfiche Appendix is attached hereto and forms a part of this application. The Microfiche Appendix includes 3 microfiche with a total of 247 frames.

BACKGROUND OF THE INVENTION

An electronic component is generally soldered onto printed circuit boards in one of two ways. Using a first approach, the component is mounted to a surface on one or both sides of the printed circuit board (known as "surface mount" technology). Alternatively, the component is mounted to the printed circuit board by mounting the body of the component on one side of the printed circuit board, inserting leads through holes in the board plated with a conductor (such as copper), and applying solder to the leads on the opposite side of the board (known as "through hole" technology). Through hole technology is well illustrated in FIG. 1 which shows a cutaway view of a single lead 1 inserted through a through hole 2 covered with copper laminated pad 3 in printed circuit board 10 (made of fiberglass/phenolic) and solder 4 holding lead 1. This patent application relates to both types of mounting in which the "bottom" side of the board will be "wave soldered".

Automated wave soldering systems for wave soldering of through hole components and surface mount components include a series of apparatus or stations within the system, each of which performs one step in the soldering process. The soldering process begins with the application of flux and/or other fluid used in preparation for soldering onto a printed circuit board, followed by the preheating of the board and the application of solder to the leads (in "through hole" technology) or component (in "surface mount" technology) protruding from the bottom of the board. The board is transported in the wave soldering system along a conveyor.

A significant problem with this prior art automated process has been that in some instances a bridge of solder has formed between adjacent conductors causing a short circuit. In through hole technology (FIG. 1), upon application of the solder to the bottom surface of the printed circuit board, strong adhesive forces bond the negatively-charged solder 4 which adheres by capillary forces between the wettable lead and positively-charged copper laminated pad 3 around through holes 2 and to the positively-charged copper leads 1 on the components passing through holes 2. In surface mount technology, the same type of forces bond the solder to surface mount component terminations. The solder molecules bond to each other with less strong cohesive forces. Therefore, excess solder between joints typically falls away and does not create a bridge. However, where joints are very close together, where leads are improperly clinched, or where the components mounted to the board have long leads which extend from the surface of the printed circuit board more than approximately 0.030 inches, or 0.8 mm, the strength of the adhesive forces may cause a bridge to form. Several processing-related factors related to wave dynamics, conveyor speed, conveyor angle, and/or using insufficient or no flux prior to soldering or using nitrogen during soldering either of which may increase surface tension, may also result in the formation of bridges.

FIG. 2A illustrates the bottom of a sample printed circuit board 10 before wave soldering. On this "mixed technology" board, to which this invention is by no means limited, some components are surface mounted and some components are mounted with through hole technology to form a printed wire assembly. Those components which are mounted with through holes to board 10 include D-Sub connectors 20, 21 which are mounted through through holes in board 10 and pin headers 23, 24. Components which are surface mounted to the bottom of illustrated board 10 include SOIC's (small outline integrated circuits) 30, 31, SOT's (small outline transistors) 33 and chip resistors 34–37. Also illustrated are large and small vias 25, 26, respectively, through which current is supplied to components on top of board 10 and mounting holes 22. The top of board 10 is illustrated in FIG. 2B.

FIG. 2C illustrates board 10 of FIG. 2A after wave soldering (and without any debridging). As shown, bridges 40, 41, 43 in board 10 have formed between terminations on SOIC 31, between chip resistors 34–36, and between chip resistor 37 and SOT 33, respectively.

FIG. 2D shows a cross-sectional view of board 10 of FIG. 2C along line D–D'. In addition to bridges 40, 41, 43, bridges 44, 45 have formed between leads 50, 51 on connector 21 and between leads 52, 53 on pin header 24 during wave soldering.

The cohesive forces in the solder strengthen as the solder solidifies. Thus, a bridge can be removed without damaging the joint only if the solder has not solidified. The time of solidification is dependent on several variables including the solder alloy used, the solder temperature, board mass, solder mass and environment temperature. One time consuming method of removing a bridge is to inspect each board for bridges after it exits from the mass soldering system, manually removing the bridge of existing solder with a soldering iron and/or soldering wick and manually resoldering the joint.

An alternative to manual debridging, currently in use in some commercial wave soldering systems, is to incorporate a hot air knife following the soldering station. This type of hot air knife is described in U.S. Pat. Nos. 4,401,253, 4,402,448, and Re. 32,982. The hot air knife shown in these patents (which is also implemented to some degree commercially by Electrovert Ltd., Grand Prairie, Tex.) comprises a manifold extending the entire width of the conveyor. The Electrovert hot air knife blows the entire width of the conveyor regardless of the width to which the conveyor is adjusted. Compressed air or inert gas is output from the orifice of the hot air knife at a high flow rate and is aimed at the bottom of the board following the application of the solder while the solder is still molten. While the adhesive and capillary forces retain the solder on the joints, the hot air knife breaks the cohesive forces and "relocates excess solder on, and/or blasts excess solder from the underside of the board, interconnections, leads, and bodies, and in doing so also minimizes the possibility of solder bridging or icicling or short formation upon solidification." Re. 32,982, col. 5, lines 48–52.

Electrovert's AccuKnife has both a vertical adjustment in the height of the nozzle and an adjustment of the nozzle towards or away from the wave, both requiring movement of the entire manifold.

Electrovert currently manufactures commercial products known as AccuKnife, a hot air debridging tool, and coN$_2$tour$^{PLUS}$, a similar device which performs the debridging function using inert hot gas. Re. 32,982 describes the stream as heated to a temperature in the range of 93° C.–350° C. It is applicants' understanding that in Electrovert's commercial products the stream of air or inert gas must be heated to a temperature above the temperature of molten solder (known as the eutectic point of solder, which for the current standard 63/37 tin/lead solder alloy is 183° C.).

Electrovert's present commercial hot air knives (including AccuKnife and CoN$_2$tour$^{PLUS}$), and the hot air knife shown in U.S. Pat. Nos. 4,401,253, 4,402,448, and Re. 32,982 present significant disadvantages because they extend over the entire width of the conveyor system carrying the printed circuit board and operate continuously at a high flow rate when the soldering system is on. These hot air knives, therefore, unnecessarily treat the entire bottom surface of the board although many, if not most, of the joints do not require debridging. As a result, defective joints are induced and some weaker joints, including larger joints, such as large vias 25 or mounting holes 22, where cohesive forces of solder joints are weak, are blown out, thereby adversely affecting the reliability of the board. The boards have to be inspected and manually repaired after application of the hot air knife when this occurs. The prior art also creates additional work to clean the soldering equipment of undesirably blown out weak joints.

Moreover, the application of a large quantity of heated air required by the prior art further dictates that the manifold in which the air is heated be relatively large and therefore heavy, and consume large amounts of energy to compress and heat the air. Increased air conditioning is also needed to cool the room in which the soldering system is operated due to the amount of heat exhausted by the prior art system.

These disadvantages are particularly pronounced in the Electrovert AccuKnife in which the hot air knife always remains on and compressed air or gas is continuously output from the orifice of the hot air knife while the soldering system is activated.

The CoN$_2$tour$^{PLUS}$ suffers somewhat less from these disadvantages as the inert gas only flows at a rate required for debridging when a printed circuit board travelling through the conveyor system is above the hot air knife. When the printed circuit board is not above the hot air knife, the CoN$_2$tour$^{PLUS}$ emits a constant bleed stream at a low flow rate.

SUMMARY OF THE INVENTION

It is therefore an object of the invention to provide a debridging tool that selectively debridges only areas of a printed circuit board or flexible circuits which are prone to bridging to minimize the area to be debridged.

It is a further object of the invention to provide a selective debridging tool that only blows air or gas with enough force to impact the solder joints for debridging when it is under an area of the printed circuit board that is to be debridged.

It is a further object of the invention to provide a selective debridging tool that does not induce defects in a printed circuit board by blowing out soldered joints in an area of the printed circuit board where cohesive forces are weak, but are integral to the device in which the board is used (such as mounting holes).

It is a further object of the invention to provide a selective debridging tool where the pressure of air or inert gas emitted on the printed circuit board may be varied between different areas of the printed circuit board.

It is a further object of the invention to provide a selective debridging tool that significantly reduces the amount of energy used for debridging purposes.

It is a further object of the invention to provide a selective debridging tool that significantly reduces the amount of gas used.

In accordance with the present invention, a tool is provided for removing solder from only specifically targeted areas of a printed circuit board where bridges or excess solder forms, each target area comprising a first surface area which is only a portion of the entire surface area of the printed circuit board. In a first aspect of the invention, the tool comprises a movable nozzle having an orifice for emitting an air or gas stream onto the printed circuit board and a means for transporting the nozzle automatically in a first direction to the first surface area of the printed circuit board for removing solder from the first surface area. A heater is provided to heat the air or gas stream before it is emitted from the nozzle.

The debridging tool is incorporated into an automated soldering system having a soldering station for generating a soldering wave positioned adjacent and preceding said debridging tool. To enhance the operation of the debridging tool, the nozzle is adjustable toward or away from the soldering station. The nozzle is also adjustable vertically toward or away from the printed circuit board and may be rotated about a vertical axis. Moreover, the configuration and orientation of the nozzle may be varied.

Using the debridging tool provided, selected areas of a printed circuit board may be debridged following the application of a solder wave to the printed circuit board, by moving the nozzle over a first area of the printed circuit board where there is a bridge or excess solder of solder at a first speed and emitting the air or gas stream only while the nozzle passes under the area to be debridged or reshaped. After debridging a first area, one or more other areas may be similarly debridged or reshaped. While the air or gas stream may be emitted on the first area at a first pressure, the stream may be emitted on each of the other areas to be debridged at a different pressure.

In a second aspect of the invention, the debridging tool may comprise a plurality of nozzles. The plurality of nozzles may be mounted to a single nozzle assembly or separate nozzle assemblies which move independently but operate in a coordinated manner to each debridge different areas of the printed circuit board.

BRIEF DESCRIPTION OF THE DRAWINGS

The inventions and modifications thereto will become better evident from the detailed description below in conjunction with the following figures:

FIG. 2A is a plan view of a printed circuit board before the board has been soldered;

FIG. 2B is a top view of the board of FIG. 2A;

FIG. 2C is a plan view of the board of FIG. 2A after the board has been soldered and bridges have formed;

FIG. 2D is a cross-sectional view of FIG. 2B along line D–D';

FIG. 10 is a top view of the nozzle assembly of the selective debridging tool assembly shown in FIG. 7 to which the first nozzle and nozzle mount have been mounted with the axis of the nozzle positioned parallel to the direction of travel of the board and the orifice of the nozzle pointing perpendicular to the board;

FIG. 11 is a side view of the nozzle assembly shown in FIG. 10, including the in-line heater;

FIG. 12 is a front view of the nozzle and nozzle mount shown in FIG. 10 with the nozzle orifice rotated sideways;

FIG. 13 is an elevational view of the second, rectangularly-shaped nozzle which is an alternative to the nozzle of FIG. 10 with the axis of the nozzle positioned perpendicularly to the direction of travel of the board;

FIG. 14 is a top view of the nozzle of FIG. 13 mounted to a nozzle mount;

FIG. 15 is a side view of the nozzle assembly of FIG. 14 (including the in-line heater) with the nozzle positioned perpendicularly to the direction of travel of the board and the orifice of the nozzle orifice rotated sideways and pointing in the direction of travel;

DETAILED DESCRIPTION

Figure 1:
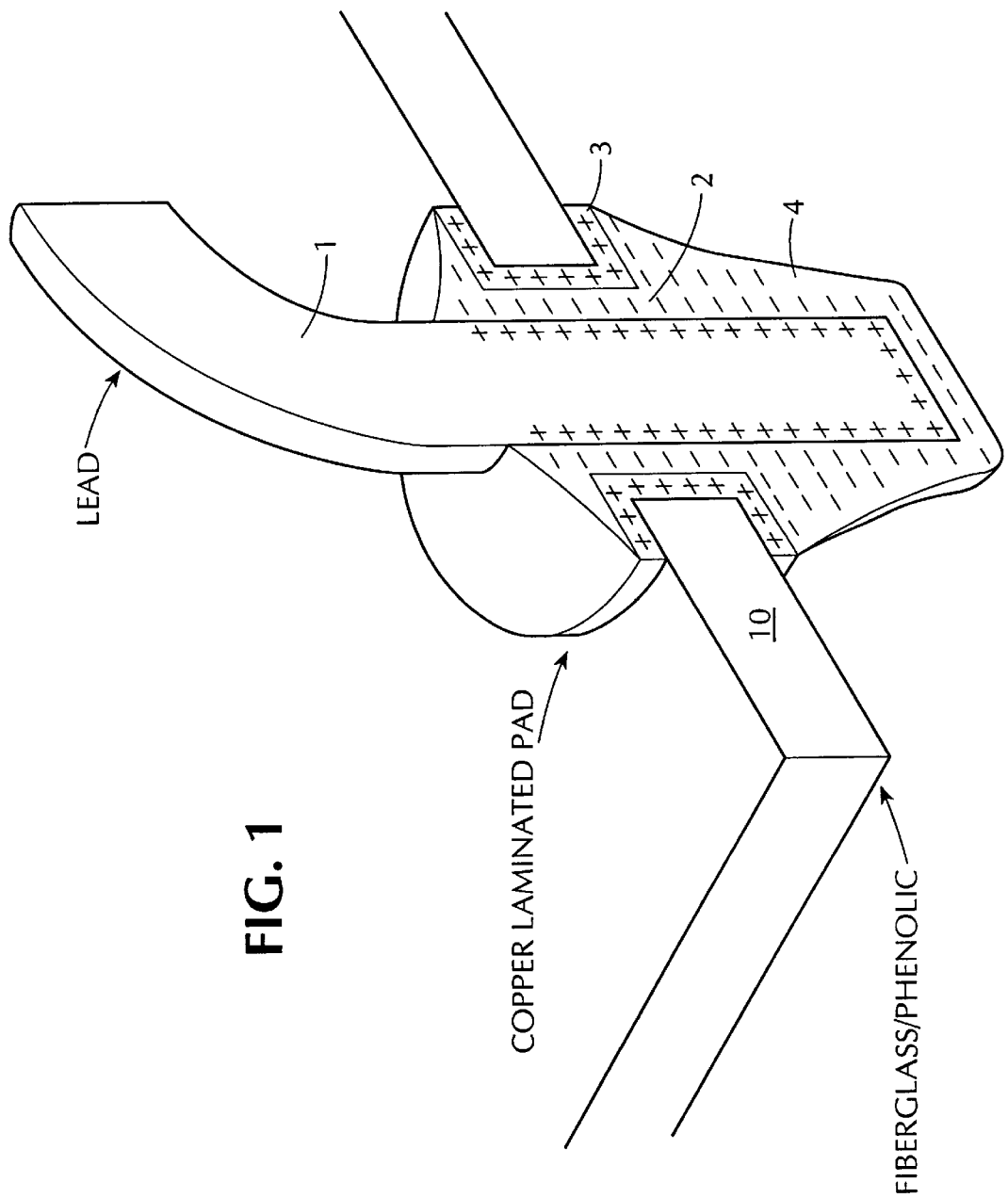
FIG. 1 is an enlarged cutaway view of a component lead passing through the board after the lead has been soldered.
Figure 3A:
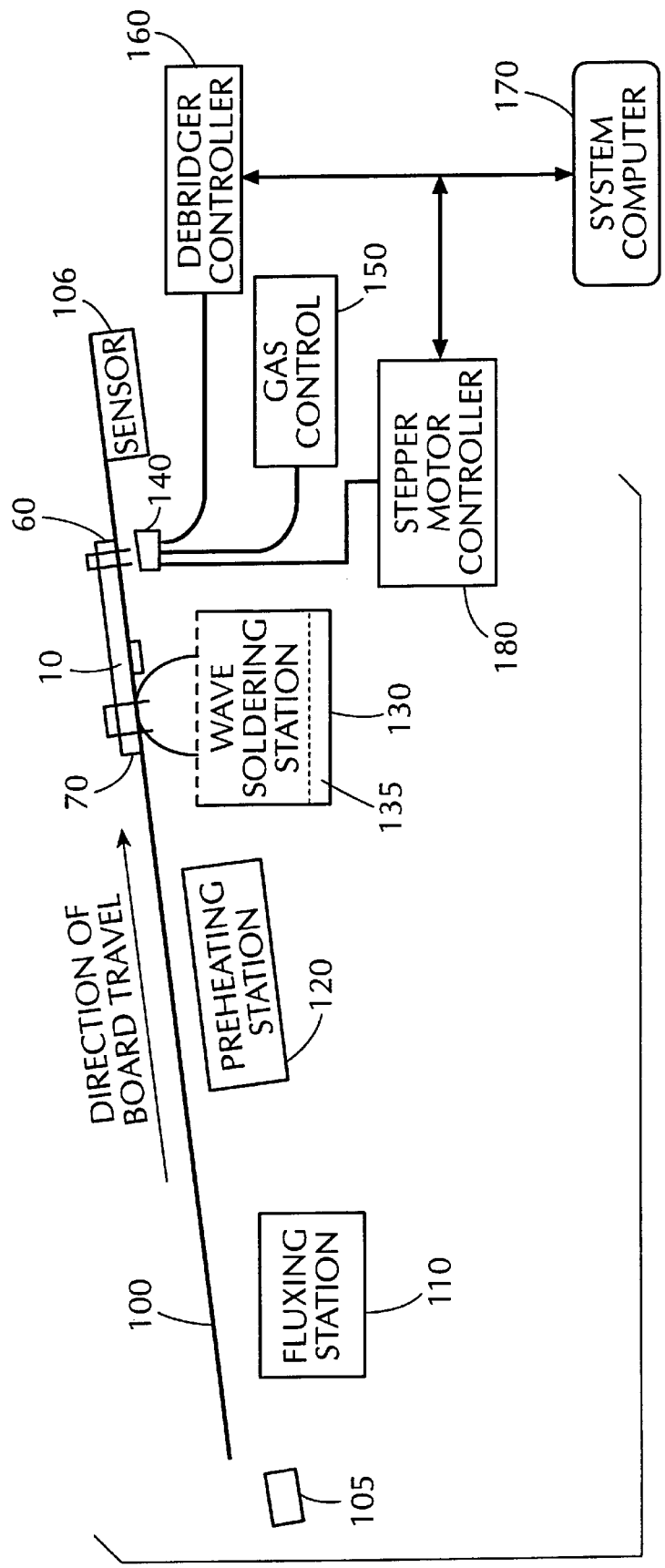
FIG. 3A is a schematic representation of a wave soldering system incorporating the selective debridging tool of the present invention.
Figure 4A:
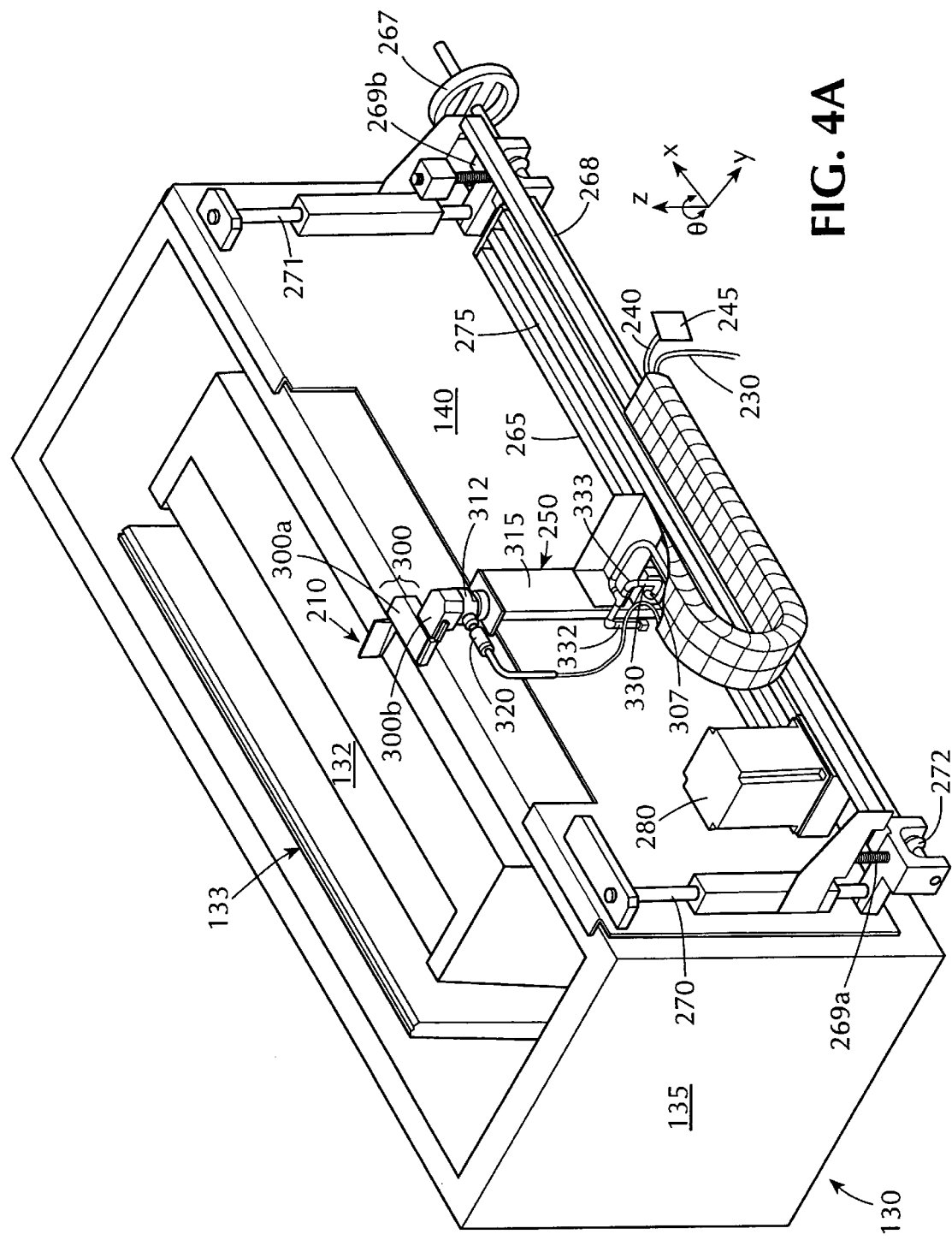
FIG. 4A is an isometric view of an embodiment of the soldering station of the wave soldering system and the selective debridging tool of the present invention with a single nozzle assembly including a nozzle, as shown in more detail in FIGS. 10–12, on the selective debridging tool such that the orifice of the nozzle is parallel to the direction of travel of the board.

Referring to FIG. 3A, the selective debridging tool of the present invention is preferably used in conjunction with and may be retrofitted for well known wave soldering systems, such as those presently sold under the designations Delta Wave and Combi Wave by Soltec B. V., the assignee of the present application, and its subsidiary company, American Soltec, Inc. In this system, which except for the selective debridging tool is well known in the art, board 10 is inserted into a conveyor system 100 at the downstream end of the system. The board is moved by conveyor 100, passing first above fluxing station 110, where flux is applied to the bottom of the board. Board 10 then passes through a preheating station 120 where board 10 is heated to a temperature usually within the range of 90 to 130° C. topside temperature. Board 10 next passes above the wave soldering station 130 where wave soldering is performed. The wave soldering station 130 may comprise a single wave (not shown) or a double wave system comprising a main wave 132 and a secondary wave 133 (which is turbulent) (FIG. 4A). Both single and double wave systems are well-known in the art. In either system, the wave soldering the station 130 comprises a solder pot 135 which serves as a reservoir for the molten solder applied in the wave soldering station.

As used herein, including in the claims, the term "printed circuit board" is defined to include any circuit assembly support such as a printed circuit board made of fiberglass/phenolic or a flexible circuit. Moreover, although the present invention may be used for removing a bridge of solder between two joints, it should be understood that the invention may be similarly used to remove excess solder from solder joints.

Figure 3B:
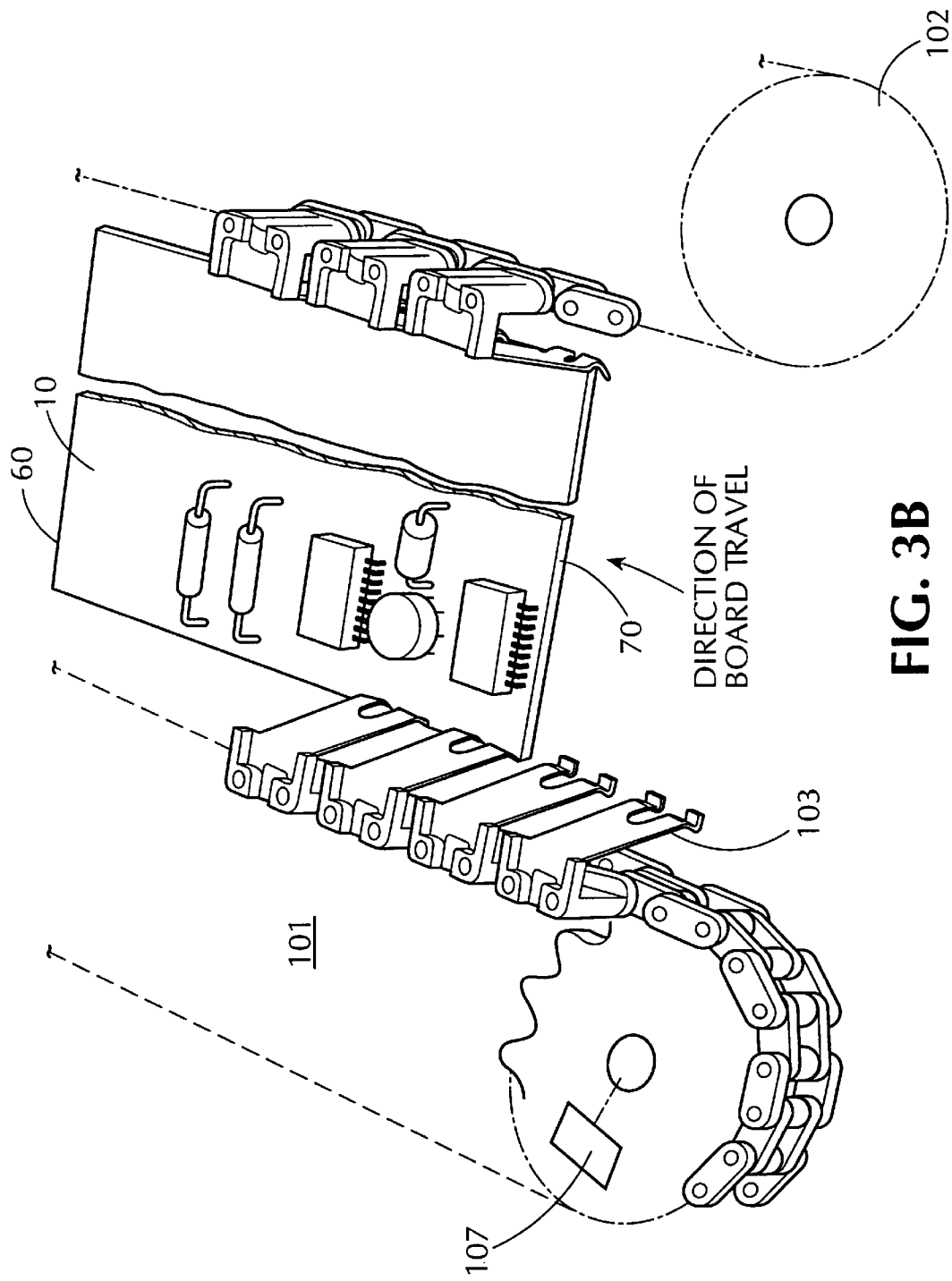
FIG. 3B is a partial perspective of a conveyor system for transporting printed circuit boards in a wave soldering system of the present invention.
Figure 6:
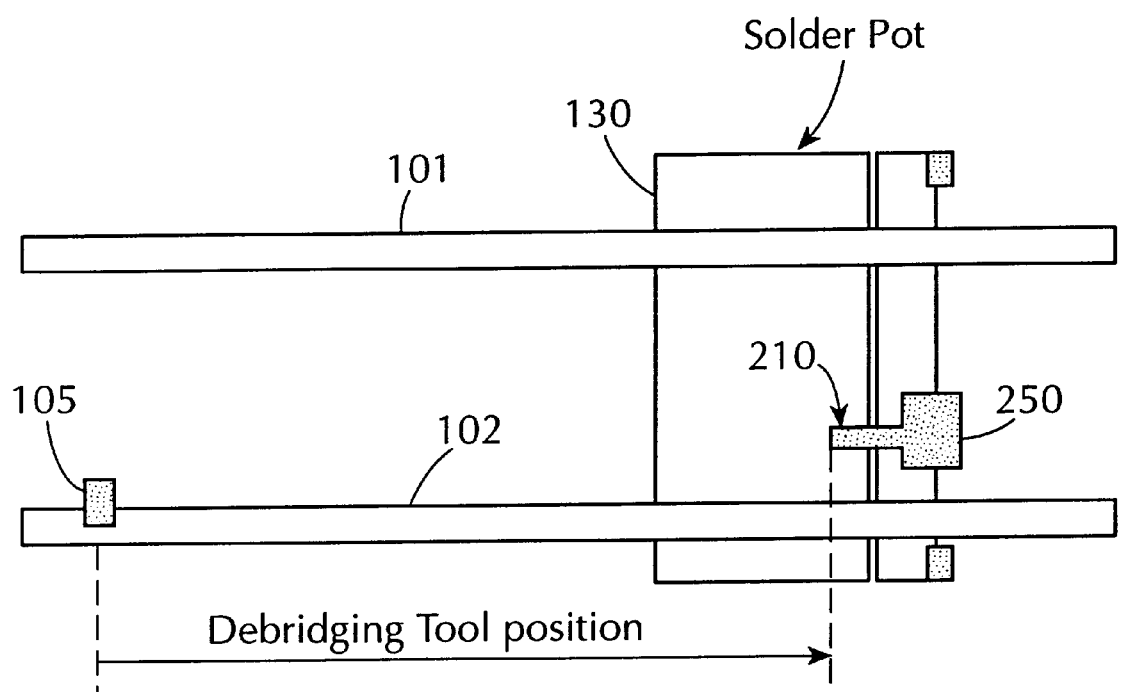
FIG. 6 is a schematic representation of an embodiment of the top of the wave soldering system showing the conveyor rails, solder station and selective debridging tool adjacent thereto.

In Soltec's wave soldering systems, conveyor 100 comprises a pair of endless chain conveyors 101 and 102, as shown in FIGS. 3B and 6. Board 10 is held between leaf-like spring members 103 connected to conveyors 101, 102 as spring members 103 move along rails of conveyors 101, 102. One example of the spring members 103 is described in detail in U.S. Pat. No. 5,029,696, which is incorporated by reference herein and which is assigned to the assignee of the present application. To allow for the transport of printed circuit boards of differing widths, one endless chain conveyor 102 is fixed while the other endless chain conveyor 101 may be adjusted either away from or towards endless chain conveyor 102 to accommodate the dimensions of the respective printed circuit boards or pallets (in which flexible circuits and other boards may be inserted) in the system.

Figure 9:
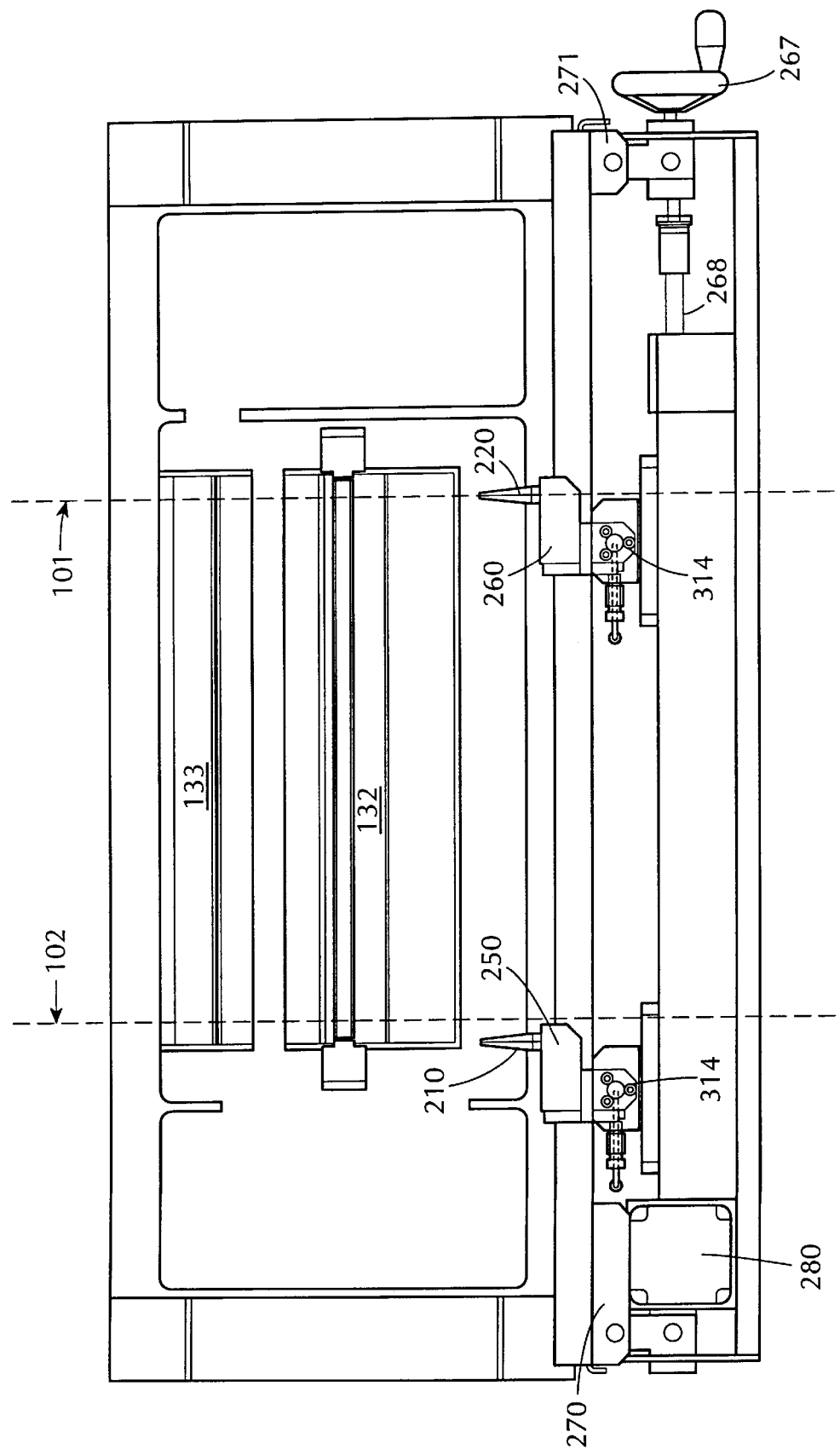
FIG. 9 is a top view of another embodiment of the wave soldering station and the selective debridging tool of the present invention with two nozzle assemblies.
Figure 16:
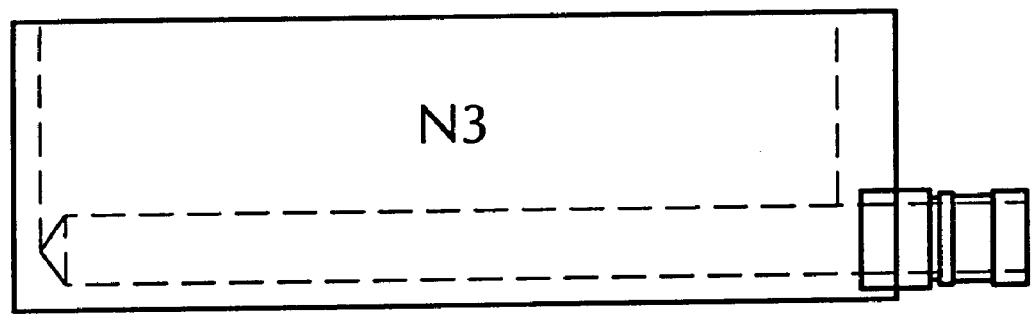
FIG. 16 is an elevational view of an elongated nozzle which may be substituted for either of the nozzles shown in FIGS. 10 and 12.
Figure 17:
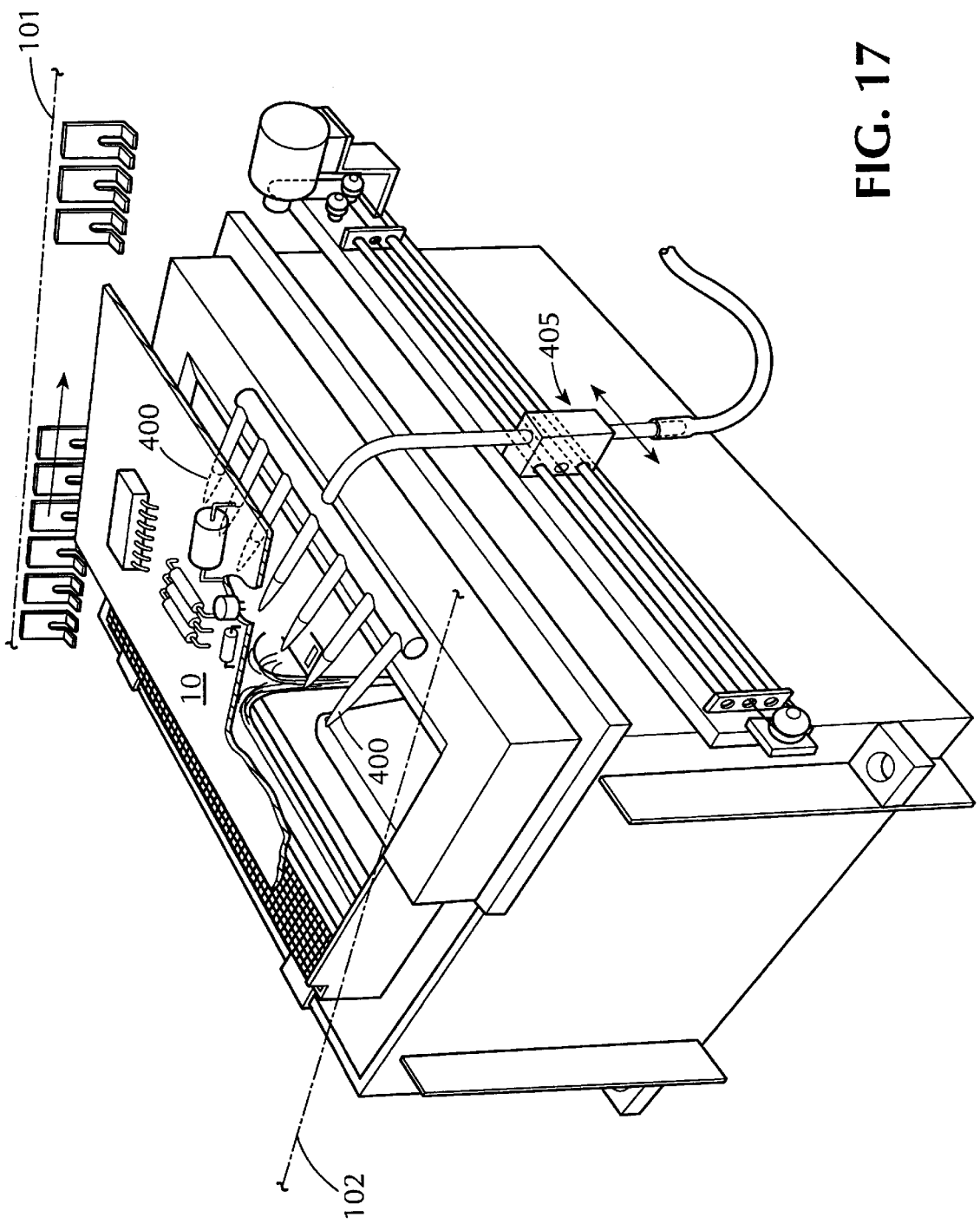
FIG. 17 is a partially cutaway, perspective view of a further embodiment of the present invention with multiple nozzles attached to a single transverse.

The selective debridging tool 140 of the present invention is mounted to the exit end of the solder pot on wave soldering station 130 (FIG. 3A). The selective debridging tool 140 comprises one or more programmable and movable nozzle assemblies. In an illustrated embodiment shown in FIGS. 4A, 4B and 7, selective debridging tool 140 has a single nozzle assembly 250. FIG. 9 shows a similar embodiment but with two nozzle assemblies 250, 260, each having a single nozzle. Nozzle assemblies 250, 260 in the embodiment shown in FIG. 9 work in conjunction to perform selective debridging. In a further embodiment shown in FIG. 17, multiple nozzles 400 are attached to a single nozzle assembly 405. Circuit board geometry, including the positioning of where the bridges form on a particular board, will determine the precise number of nozzles and nozzle assemblies required to adequately debridge that board.

Using more than one nozzle saves travel time of the nozzles to reach the area of the board to be selectively debridged and is particularly helpful where there are many bridges to debridge on a particular board or if the board is traveling along the conveyor at a fast rate of speed. Multiple nozzles may or may not move in unison.

Figure 8:
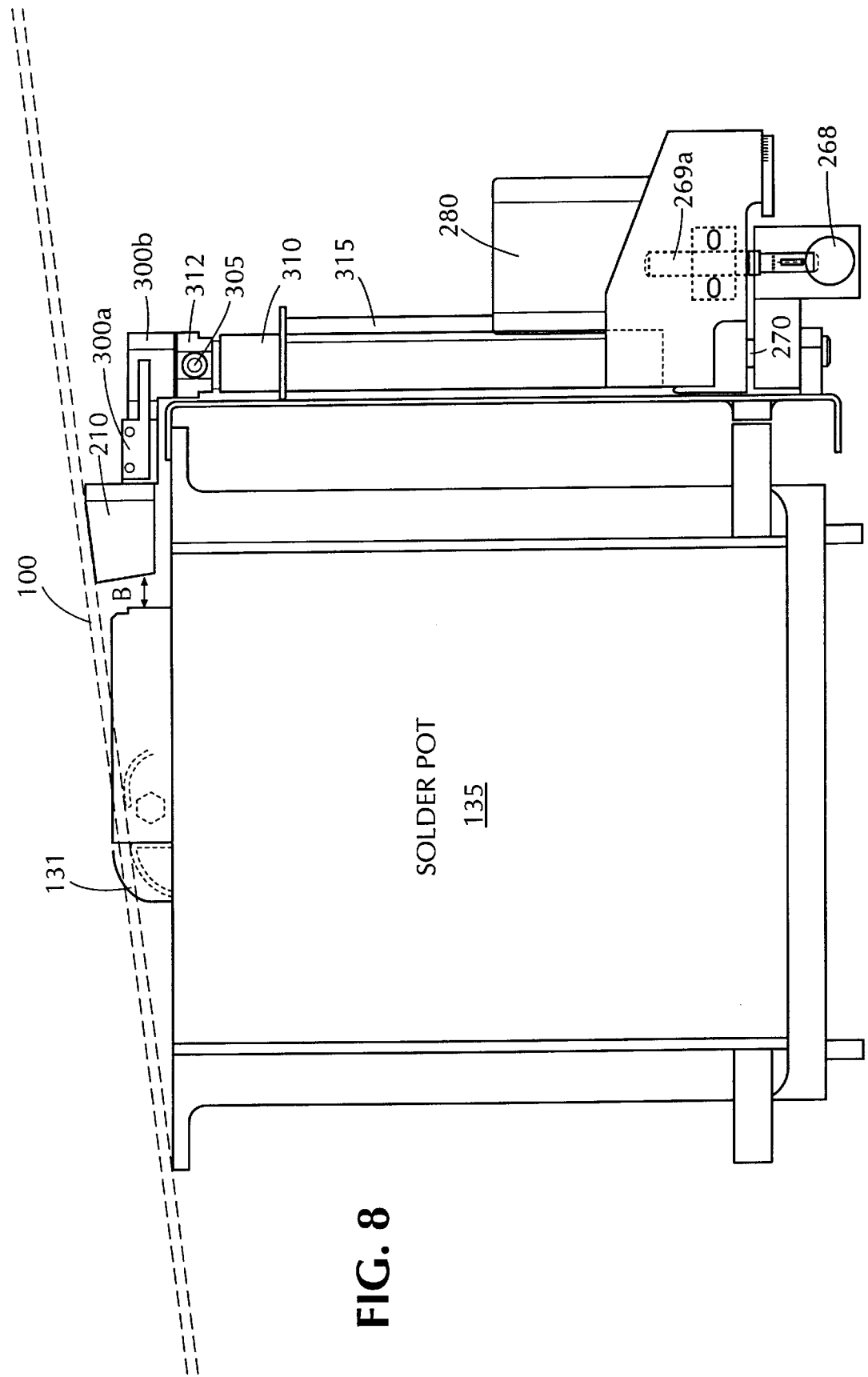
FIG. 8 is a side view of the embodiment shown in FIG. 7 of a wave soldering station and the selective debridging tool of the present invention.

In the embodiment shown in FIG. 4A, nozzle assembly 250 comprises a nozzle 210, nozzle mount 300 to which nozzle 210 is welded, a nozzle carrier mount 312 to which nozzle mount 300 is mounted with three screws 314 (FIGS. 10 and 14), and a conventional in-line heater 310 (FIGS. 8 and 11). A C-shaped plate 315 covers the back of heater 310. Heater 310 is a cylindrical heater such as the Omegalux Model No. AHPF-102, which is a 10" long pipe with an 8" heater section and using approximately 1200 Watts. The selective debridging tool further comprises a temperature sensor 320 such as a resistance temperature device (RTD) or a thermocouple. Temperature sensor 320 is inserted through a hole 305 in the nozzle carrier mount 312 between heater 310 and nozzle mount 300 or may be inserted in another suitable location in the nozzle assembly 250. A stream of air or inert gas is provided through tubing 332 and enters nozzle assembly at 306. Additional tubing branches off from tubing 332 and enters inlet 307 to pressure sensor 330. Pressure sensor 330 monitors the pressure of the air or gas stream to ensure that there is pressure and air or gas flow to the heater element when the heater 310 is turned on.

Nozzle assembly 250 is mounted to a transverse or rail 265 along which nozzle assembly 250 is movable in the x-direction. In the embodiment of FIG. 4A, nozzle assembly 250 is mounted to a channel (not shown) on the front side of transverse 265. The movement of the nozzle assembly 250 in the x-direction is controlled by computer-controlled stepper motor 280 which is coupled to nozzle assembly 250 with a belt which sits in channels 275, 276.

Where there are two nozzle assemblies 250, 260 (FIG. 9), each nozzle assembly 250, 260 preferably has a nozzle 210, 220, respectively. Each of nozzle assemblies 250, 260 is mounted to a respective transverse or rail along which a nozzle assembly is movable in the x-direction. The movement of nozzle assembly 260 is controlled by a second stepper motor (not shown).

Figure 7:
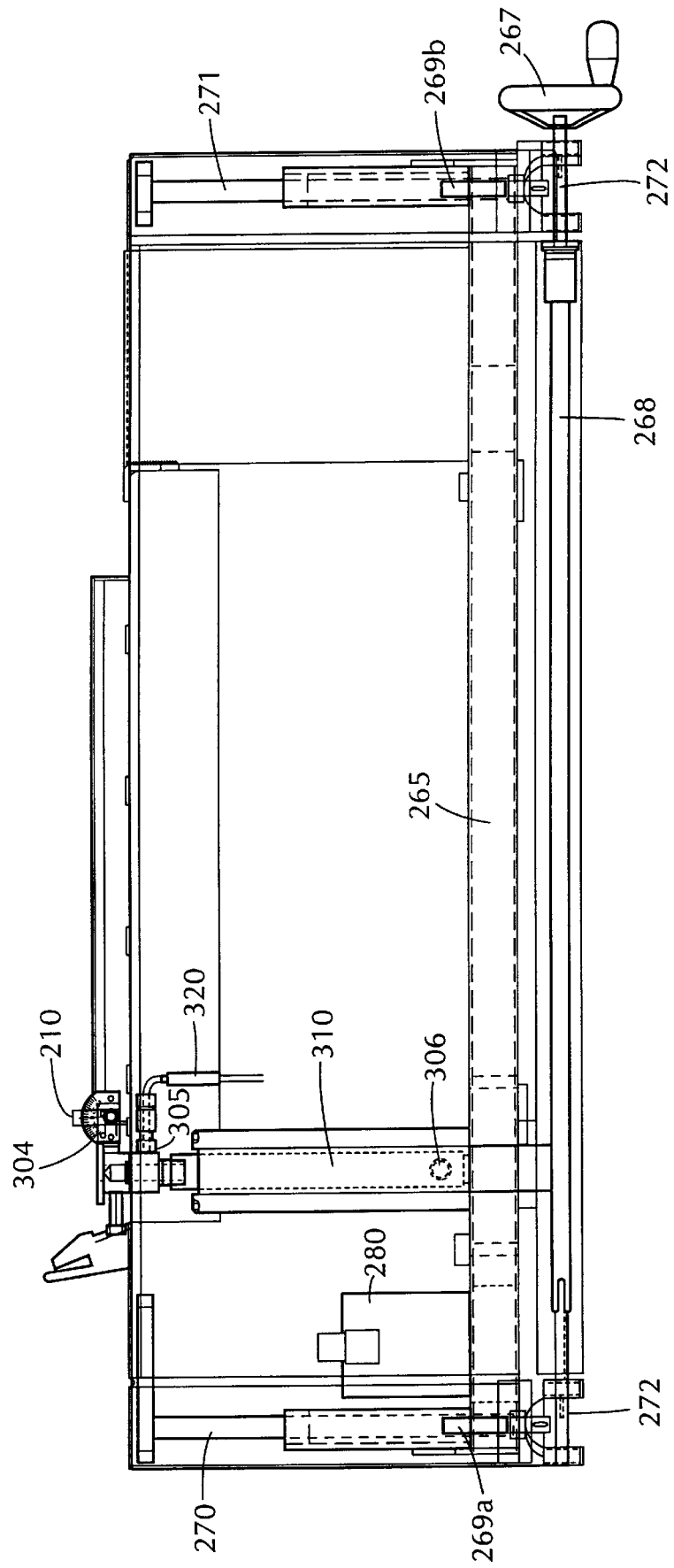
FIG. 7 is an elevational view of an embodiment of a nozzle assembly of the selective debridging tool adjustably mounted to the back of the soldering station of the wave soldering system of the present invention.

The position of nozzle 210 in the illustrated embodiment is manually adjustable up and down in the z-direction by adjusting the height of transverse 265 (FIGS. 4A and 7). Transverse 265 travels along a pair of vertically mounted rails 270, 271 that are mounted to the exit end of the solder pot upstream of wave soldering station 130. The first vertically mounted rail 270 is mounted at one end of the back of the solder pot and the second vertically mounted rail 271 is mounted at the opposite end. A rotatable height adjustment handwheel 267 on the side of the selective debridging tool is coupled to a lead screw 268 which extends over the width of the selective debridging tool in the x-direction. Lead screw 268 is in turn coupled with gears 272 to vertical rotating threaded shafts 269a, 269b, one shaft 269a adjacent rail 270 and the other shaft 269b adjacent rail 271. Thus, the height of transverse 265 is manually adjustable by turning handwheel 267. The adjustment may be automated by attaching a motor to lead screw 268. While handwheel 267 is shown on the back of the wave soldering system, for the convenience of the system operator, handwheel 267 may be moved to the opposite side of the selective debridging tool, which is the front of the wave soldering system.

Where there are two nozzle assemblies each having its own transverse, the second transverse is similarly connected to permit the height adjustment of the second nozzle assembly as well.

The distance between nozzle 210 and the wave(s) in wave soldering station 130 in the y-direction is likewise manually adjustable with a slide and set screw 308. A ruler 309 may be formed on the side of the nozzle 210 to simplify the adjustment (FIG. 10) The distance between the nozzle 210 and solder wave should be kept to a minimum so as to selectively debridge the board while the board is still retaining heat from the solder wave. Thus, pressures could be kept lower than would otherwise be necessary if some heat from the solder wave had dissipated. However, nozzle 210 must not be placed too close to the wave or angled so as to disturb the wave because this could cause additional bridging and/or misses, i.e., no soldered joint would form. For example, having the debridging nozzle directed into the solder at excessive flow/pressure would disturb the interface area where the board exits the wave.

Nozzle 210 may rotate over angle θ (FIGS. 4A, 4B) about the z-axis (a "pitching" motion) by coupling a motor to a drive shaft (not shown) on nozzle assembly 250 with gears such as worm gears or other suitable gears. This rotational movement may occur either before or during debridging, as necessary.

Adding further flexibility, nozzle 210 may also be manually adjusted over angle φ. (FIGS. 12 and 15). A protractor 304 may be provided on nozzle mount 300 adjacent nozzle 210 to assist in adjusting nozzle 210 over angle φ (FIGS. 7, 12, 15). The top of protractor 304 may be cut off if it interferes with the operation of the selective debridging tool. A ratchet or index (not shown) may also be provided to permit the adjustment of the nozzle over angle φ degree by degree.

The various configurations of nozzle 210 for debridging particular circuit boards may differ from board to board. The nozzle should be designed such that the nozzle orifice will be brought as close as possible to the board to reduce the amount of energy needed to heat the air or inert gas and to minimize the pressure of the air required to debridge or to remove excess solder, as discussed below. Generally, the nozzle may be brought less than 10 mm away from the board, as long as there is no interference from leads or hardware on the board. To allow for various nozzle configurations, nozzle 210 is designed to be removable (by removing screws 314) and replaceable with nozzles of different configurations.

Figure 4B:
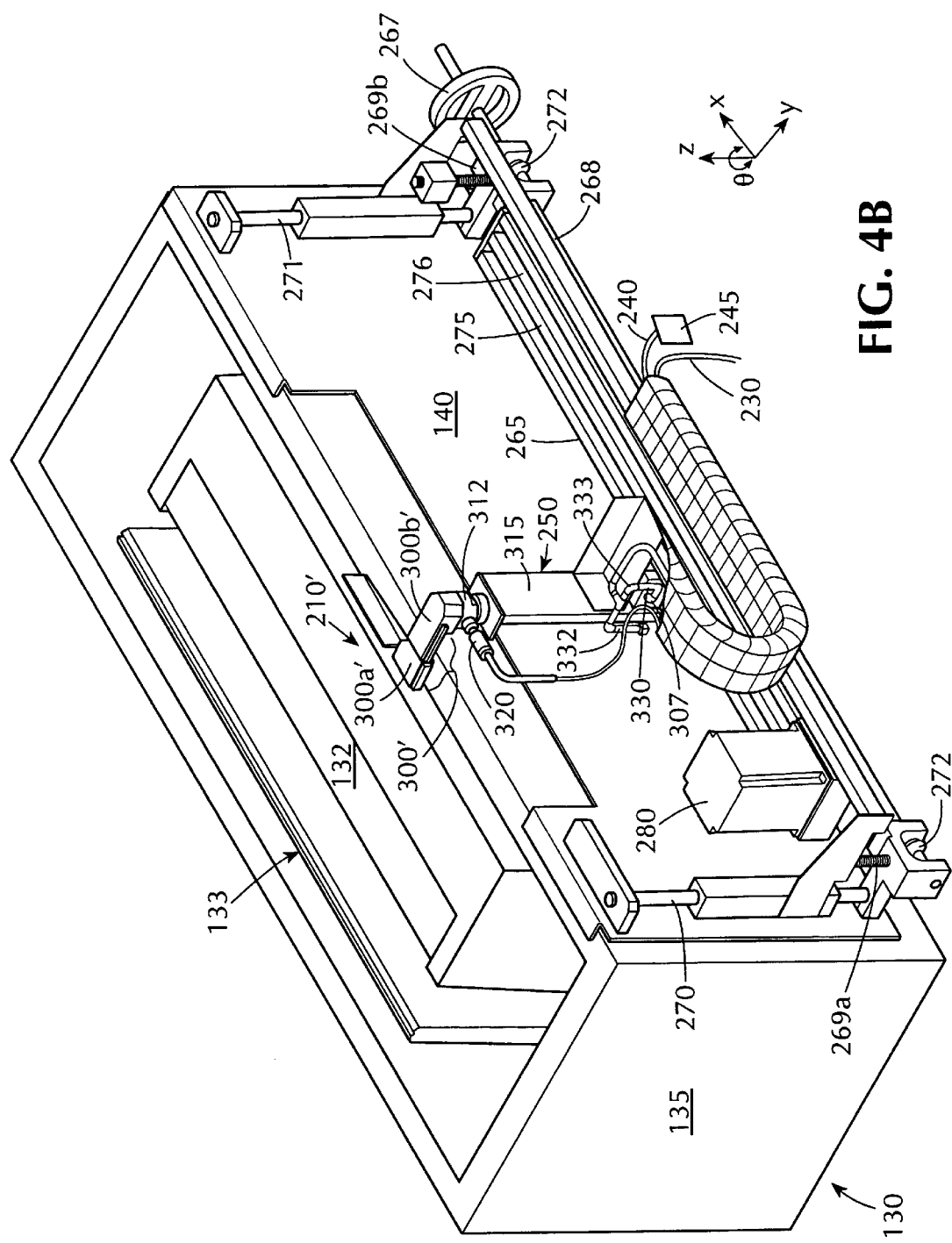
FIG. 4B is an isometric view of an embodiment of the soldering station of the wave soldering system and the selective debridging tool of the present invention with a single nozzle assembly including a nozzle, as shown in more detail in FIGS. 13–15, attached to the selective debridging tool such that the nozzle is perpendicular to the direction of travel of the board.

As illustrated in FIG. 4A, nozzle mount 300 may comprise multiple sections 300a, 300b that are welded together to form a single piece that is removably attached, as with threaded connections, to in-line heater 310. Section 300a is positioned such that the nozzle orifice is positioned lengthwise in the direction of travel of board 10. FIG. 4B is identical to FIG. 4A except for the nozzle 210' and nozzle mount 300' which has been substituted for nozzle 210 and nozzle mount 300. Nozzle mount 300', also comprising multiple sections 210a', 210b', is designed to position the orifice of nozzle 210' lengthwise perpendicularly to the direction of travel of board 10 and perpendicular to conveyors 101 and 102.

In those instances where the nozzle will be positioned most of the time with the nozzle orifice lengthwise along the y-axis in the "parallel nozzle position" as in FIG. 4A (i.e., nozzle assembly 250 is not generally rotated over angle θ from the position shown) and the conveyor is sloped upwards from the entry to exit sides of the wave soldering system, nozzle 210 is preferably used and the upper surface 350 of nozzle 210 is preferably trapezoidally shaped with an upward slope in the direction of the conveyor substantially equal to the slope of the conveyor as shown in FIG. 11. For ease of reference, the trapezoidally-shaped nozzle will be referred to as an N1-type nozzle. For example, where nozzle 210 is in the parallel nozzle position, if the slope of the conveyor is 7 degrees, the slope of the upper surface of nozzle 210 is designed to be 7 degrees also. This permits the air or inert gas emitted from orifice 215 to uniformly contact board 10 as closely as possible to board 10, due to the upward slope of the conveyor system 100. This trapezoidally-shaped nozzle is, for example, preferred to debridge SOIC 31 (FIG. 2A) as rapidly as possible in a sloped conveyor system since SOIC 31 is positioned lengthwise along the y-axis with the front edge 60 of board 10 extending across conveyors 101, 102.

In those instances where the nozzle will be positioned most of the time with nozzle 210' lengthwise along the x-axis in the "perpendicular nozzle position" as in FIG. 4B (i.e., nozzle assembly 250 is not generally rotated over angle θ from the position shown), instead of a trapezoidally-shaped nozzle N1, nozzle 210' is preferably rectangularly-shaped (FIG. 13), permitting nozzle orifice 215' to be as close as possible to board 10. For ease of reference, this rectangularly-shaped nozzle will be referred to as an N2-type nozzle. This nozzle shape would be preferred to debridge SOIC 30 as rapidly as possible since SOIC 30 is positioned lengthwise along the x-axis with the front edge 60 of board 10 extending across conveyors 101, 102

Alternatively, either nozzle 210 or nozzle 210' may be positioned in any manner which is best suited to debridge a selected portion of board 10.

Nozzles 210 and 210', regardless of their shape, may be short (FIG. 7) or long (FIG. 12). For ease of reference, a long, rectangular nozzle will be referred to as an N3-type nozzle. The length of orifices 215, 215' should be in the range of 8 mm–100 mm, dependent on the board configuration. A preferred length of an orifice on a short nozzle, such as N1-type and N2-type nozzles, is 40 mm. If the orifices are made longer than 100 mm, gas blasts from the selective debridging tool cause board 10 to cool too greatly before the debridging process is accomplished. One possible width of the orifices 215 and 215' is approximately 0.5 mm.

As explained above, in the embodiments shown, the ranges over which nozzle angles θ and φ, the distance between the nozzle and the board and the distance between the nozzle and the wave are manually adjustable over varying ranges which depend on the nozzle used. Table I below indicates the currently preferred ranges for nozzle configurations N1 (positioned as shown in FIG. 4A), N2 (positioned as shown in FIG. 4B), and N3 (positioned as nozzle N2 in FIG. 4B) when used in American Soltec's Combi wave machine. In other embodiments which are not illustrated, the adjustments may be automated.

TABLE 1

Figure 5:
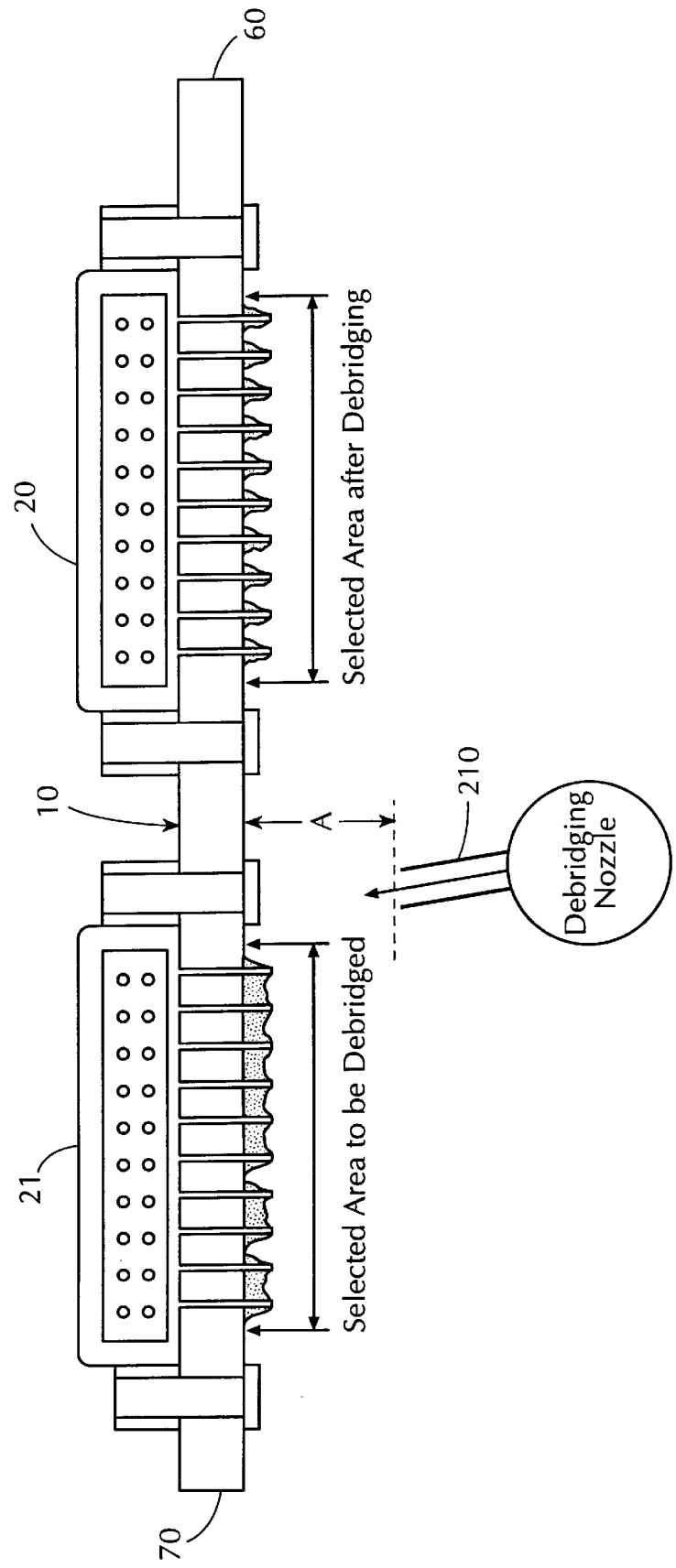
FIG. 5 is a front view of the board illustrating the D-Sub connectors after one of the D-Sub connectors has been debridged using an embodiment of the present invention.

| | |
|---|---|
| Nozzle distance from board A (FIG. 5) | N1: 1.5–20 mm |
| | N2: 1.5–20 mm |
| | N3: 1.5–20 mm |
| Nozzle distance to Wave B (FIG. 8) | N1: 0–13 mm |
| | N2: 0–40 mm |
| | N3: 0–40 mm |
| Nozzle angle φ * | N1: 50-0-50 ° |
| | N2: 50-0-50 ° |
| | N3: 50-0-50 ° |
| Nozzle angle Θ * | N1: 50-0-50 ° |
| | N2: 50-0-50 ° |
| | N3: 50-0-50 ° |

* The ranges for nozzle angles φ and Θ for N1, N2 and N3 may be increased to 90-0-90 °.

A second heater (or "preheater") 245 may be installed to preheat the air or inert gas before it reaches the heater 310. Like heater 310, preheater 245 would be equipped with an RTD or thermocouple measuring device for temperature control.

The electrical and air connections to nozzle assembly 210 are enclosed within two flex cable ducts, shown in FIG. 4A as duct 230 for the wires extending from heating element used for preheating and pressure sensor 330 and duct 240 for the air or inert gas tube 332. As the air or gas supplied to nozzle assembly 250 may be preheated with preheater 245, two separate cable ducts should be used to prevent temperature problems with the wiring. Cable duct 240 should be a thermally isolated tube to reduce the loss of heat as the air is forced from preheater 245 to nozzle assembly 250.

Wave soldering systems, such as the system shown in FIG. 3A, are generally adjustable to accommodate printed circuit boards of different sizes and with different layouts and types of components. (Board 10 shown in FIGS. 2A–2D is only one example.) The selective debridging tool may be similarly adjusted to accommodate the various board layouts that a manufacturer will typically mass solder. One skilled in the art is able to determine which areas of a particular printed circuit board require debridging by testing samples of each board, passing several identical boards through the soldering system and visually inspecting each board to determine whether bridges repeatedly form during all or most runs in the same place on the board. If bridges repeatedly form in one area of the board, those areas are appropriate sites for automated debridging. Although testing each board layout may seem overly burdensome, in practice it is quite feasible to determine the proper parameters for operating the selective debridging tool for a particular board layout and configuration since a manufacturer of printed wire assemblies will typically mass solder many boards of each particular layout and configuration.

Once the area or areas to be targeted are ascertained, additional testing is performed to optimize various parameters such that the bridges are debridged without blowing out good joints or mounting holes which cannot withstand the pressure. The parameters to be determined include how close the nozzle must be to the board in the z direction and to the wave in the y-direction, the selected temperature of the air or inert gas emitted through the nozzle, the length of time the air or inert gas is emitted before it is turned off, the shape, size and orientation of the nozzle installed, whether more than one nozzle is required to debridge a particular board, and the independent pressure setting for each area of a board requiring debridging. In programming the appropriate recipe, it should be noted that tests have shown that the temperature of the air or gas stream emitted from the nozzle orifice is 30–40° C. less than the temperature as measured at temperature sensor 320.

It has been determined that the setting of the pressure to be applied is more significant than the temperature of the air or inert gas stream. The nozzle of the selective debridging tool is very close to the soldering station 130 and the board still retains latent heat from the soldering process during debridging.

In the illustrated embodiment, some of the referenced variables for a particular board are set manually while others, including the settings for which area or areas are to be targeted by the selective debridging tool, are programmed into the computer. Based on the tests for bridge formation, the settings that are automatically controlled are programmed into the computer and saved into a "recipe" which is later selected whenever the board corresponding to the recipe is to be debridged. Many of the variables which are manually set may alternatively be automated, with various modifications to the selective debridging tool, and included as variables in the recipe.

To operate the selective debridging tool, the manual adjustments necessary to optimize the debridging operation for that board are made, the recipe for that board is selected on the computer, and the software switch on computer 170 for the selective debridging tool is turned on. This causes the selective debridging tool to enter standby mode, settings for which are included in the recipe.

The selection of outputting either air or an inert gas is manually selectable. Depending on the type of flux chemistry used, the inert gas used may be nitrogen.

In standby mode, the nozzle remains in the designated park position. The air or gas flow is controlled by an automatic flow control valve which is opened to maintain the standby flow at a standby setpoint. This setpoint is typically only a portion of the flow when the selective debridging tool performs debridging and is designed to prevent the burn-out of in-line heater 310. After the air or gas flow begins, in-line heater 310 heats the air or gas stream to the actual recipe temperature setpoint, which is the temperature required for debridging.

A board 10 may then be inserted into the wave soldering system. Infeed sensor 105 (FIG. 3A), such as an optical sensor, incorporated into the entrance end of conveyor system 100, senses the board 10 and notifies computer 170. The location of board 10 as it moves along conveyor system 100 is tracked by an encoder of a type well-known to those skilled in the art, such as an electromagnetic or optical encoder (not shown). The encoder 107 (FIG. 3B) is incorporated into conveyor system 100 and tracks how far board 10 has traveled by generating pulses indicative of the distance conveyor 100 has moved. These pulses are also transmitted to computer 170. Computer 170, in turn, transmits this information to CDS controller 160 which controls the operation of the selective debridging tool. The user must specify in the recipe the distance between the front of the selective debridging tool nozzle and infeed sensor (FIG. 6).

Controller 160 and computer 170 communicate via an RS232 port on computer. Controller 160 is thereby able to track the position of board 10 along the y-axis in the wave soldering system.

Controller 160 uses the information concerning circuit board dimensions and geometry programmed into computer 170 in conjunction with the tracking information provided by sensor 105 and encoder 107 to precisely activate the selective debridging tool to target areas on board 10. Feedback is provided for stepper motor 280 to control and track the movement of nozzle assembly 250 along transverse 265 in the x-axis. This feedback is generated by the stepper motor controller 180 (FIG. 3A) and is linked with CDS controller 160. Feedback is likewise generated by a second stepper motor controller for a second stepper motor (not shown) which would be incorporated where a second nozzle assembly 260 is included (not shown).

The source code in the "C" programming language for files in computer 170, CDS controller 160 and stepper motor 280 devoted to the operation of the selective debridging tool is included as a Microfiche Appendix filed herewith. Files Dbx.cpp, Dbx.dat, Dialtest.rc reside in computer 170, files 720.c, ctr.c, 740.c and adc.c reside in CDS controller 160, and files X-movef.abl and X-movef par reside in stepper motor controller 180. This source code is designed to work with the Microsoft Windows 95 or Microsoft Windows 3.1 operating system.

The source code in the Microfiche Appendix contains a limitation that the maximum length of a board from front edge 60 (FIG. 5) to an opposite back edge 70 is 500 mm. Because applications exist where longer boards are used, this maximum setting should be increased to 750 mm or greater.

As board 10 passes over selective debridging tool 140, the selective debridging tool is activated with the automatic flow control activated at an appropriate time to bring the flow from the standby flow rate to the desired flow rate setpoint.

For a particular area to be debridged, the system activates the stepper motor associated with that nozzle assembly, causing the nozzle assembly to move to the start position in the x-direction specified in the recipe. The RTD with the temperature controller maintains the temperature at the actual setpoint using heater 310 to maintain the desired debridging air flow temperature. The nozzle assembly then moves from the start position over the selected area in a forward stroke toward conveyor 101 until the stop position. The forward stroke may be followed by a reverse stroke towards conveyor 102. Based on the testing, it may be determined that multiple passes over the same area with the nozzle may be necessary depending on the difficulty in debridging the area of the board.

The speed at which the nozzle moves across board 10 in the x-direction may be varied and depends on the speed of travel of the board on the conveyor. If the conveyor 100 travels more quickly, the nozzle must move at a fast speed to debridge that area in time before board 10 has passed. In one embodiment, the nozzle may be operated at a first speed in a first direction (between 0–1 m/sec) and at a second speed when moving in the reverse direction (between 0–1 m/sec), the first and second speeds being user-selectable on computer 170.

The nozzle may start, stop, or be parked or changed to a different nozzle at any appropriate place between the rails 101, 102 of the conveyor system 100 which may be spaced apart by as much as 600 mm.

When the start and stop position of the nozzle are the same, the nozzle will move to the start position on the tracking command and will not move from there until the tracking system sends it back to the standby or park position. This will generally only occur when the nozzle is in the perpendicular nozzle position.

To enhance the selectivity of the debridging process, the selective debridging tool may be programmed to operate with the air or inert gas turned on when moving in one direction and turned off when moving backwards over the same spot or, alternatively, the air or inert gas may be turned on in both directions. At least some air or inert gas flow may be required during the backward stroke of the nozzle to protect the heater element and to stabilize the temperature of the air or inert gas stream.

Another significant feature which enhances the selectivity of the selective debridging tool is that each discrete area of board 10 may be debridged at a different pressure. This allows for the selective debridging tool to be area-specific to account for various joint and component variations in the different areas of the board. Flow may be increased for debridging areas where the adhesive forces of the solder are stronger.

The air or gas flow output from each nozzle during activation of the selective debridging tool is adjustable from a minimum of 0.1 $m^3$/hour to a maximum of approximately 10 $m^3$/hour. In order to ensure the availability of this maximum flow, all air or nitrogen tubes are at least 6 mm in inside diameter, and air or inert gas is input to the system at a pressure in the range of 3 to 10 bar. The amount of flow is also dependent on the orifice size, with the longest nozzle having an orifice of 100 mm outputting the maximum flow in this embodiment.

The temperature of the air or inert gas stream emitted from the nozzle is adjustable and is generally set to a temperature less than the temperature of the molten solder. For the commonly used 63/37 tin/lead solder alloy, the air or inert gas stream is preferably heated to a temperature in the range of 21° C. to 180° C. By maintaining the temperature below that of molten solder there is reduced risk that any electronic components or that the laminate on the board would be damaged by high temperatures. However, the invention would also work where the temperature of the air or inert gas stream is set at or above the temperature of molten solder. The temperature may be controlled with a thermo measuring device such as a thermocouple or RTD (resistance temperature device) in conjunction with a manual temperature controller or a computer.

The ideal temperature of the air or inert gas depends on board mass, solder temperature, and transport conveyor speed. Due to the relatively low flow rate of the air or inert gas used in the selective debridging tool, large heaters are not required. Preheater 245 may be included in the selective debridging tool but is not required for operation of the selective debridging tool at a temperature below 180° C., even at a high flow setting.

After debridging a first area, the nozzle reenters standby mode and moves to the park position until another area on the board which it must debridge, if any, approaches. At the next area to be debridged, the nozzle will again be activated and debridge that area. This process will be repeated until all of the selected areas are debridged by that nozzle.

Where more than one nozzle assembly is used, the invention works similarly except that certain areas are debridged by the first nozzle on the first nozzle assembly and other areas are debridged by the other nozzle or nozzles on the other nozzle assemblies.

Sensor 106 (FIG. 3A), such as an optical sensor is incorporated into the exit end of the conveyor system 100 and notifies computer 170 when board 10 is at the exit of the conveyor system 100.

After debridging the first printed circuit board, if there are additional boards to be debridged, the nozzle will enter the standby mode and move to the park position until the next board arrives at the selective debridging tool.

After a run of identical boards is completed and a board with a different layout and components is to be soldered, one performs the adjustments to the manually set parameters, selects the recipe for the next board and selectively debridges that board in a similar manner.

When one finishes using the selective debridging tool, it is turned off and it enters the park mode, returning the nozzle assembly 250 to its park position, the heater is switched off.

The invention can also accommodate printed circuit boards or flexible circuits which are insufficiently stiff to be inserted into the wave soldering system. These boards are placed in a pallet which is inserted between spring members 103 of conveyors 101 and 102. To assist the tracking mechanism in locating areas to be debridged, the user specifies to computer 170 the offsets of the board from the edge of the pallet.

While the above description describes an air or gas stream being emitted from the nozzle, the invention is not limited thereto. Other appropriate fluids may be used as equivalent substitutes for the air or inert gas in the stream emitted from the nozzle, including gas mixtures and liquids not presently known.

It should be further understood that the present invention is not limited to the described embodiment. For example, additional nozzle assemblies or additional nozzles 400 on a single nozzle assembly (FIG. 17) may be provided in order to reach all of the spots on the board to be selectively debridged quickly enough. Also, as FIG. 17 (a very different alternative embodiment which will not be described in detail and is not a presently preferred embodiment) illustrates, the means for transporting the nozzle assembly may be varied to be belt-driven. Another alternative would be to substitute one or more robotic arms as the means of transporting board 10 and/or one or more of the nozzles. In addition, the system can be modified to automatically adjust the parameters described above as being set manually.

One skilled in the art will recognize that other modifications and variations can be made to the above described embodiments, which are presented for purposes of illustration and not of limitation, without departing from the spirit or scope of the invention.

Our invention is defined by the following claims:

We claim:

1. A tool for removing solder from a first surface area of a printed circuit board, said first surface area comprising only a portion of an entire surface area of said printed circuit board, said tool comprising:

a movable nozzle having an orifice for emitting an air or gas stream on said printed circuit board, and means for transporting said nozzle automatically in a first direction to said first surface area of said printed circuit board for removing solder from said first surface area.

2. The tool of claim 1 wherein said tool is incorporated into an automated soldering system comprises a transport system for transporting said printed circuit board over said tool in a second direction whereby a front edge of said printed circuit board is movable above said nozzle first, and wherein said orifice of said nozzle is narrower than said front edge of said printed circuit board.

3. The tool of claim 2 wherein said orifice of said nozzle is positioned in a third direction substantially perpendicular to said second direction.

4. The tool of claim 2 wherein said nozzle is positioned lengthwise substantially in said second direction.

5. The tool of claim 2 wherein said automated soldering system further comprises a conveyor system comprising a pair of conveyors and said first transport means comprises a means for transporting said nozzle linearly between said pair of conveyors.

6. The tool of claim 1 further comprising a second nozzle having a second orifice for emitting an air or gas stream on said printed circuit board.

7. The tool of claim 6 further comprising a second means for transporting said second nozzle to a second surface area of said printed circuit board for removing solder from said second surface area.

8. The tool of claim 1 further comprising an in-line primary heater coupled to said nozzle to heat said air or gas stream.

9. The tool of claim 8 further comprising a temperature sensor to monitor the temperature of said air or gas stream after said air or gas stream is heated by said heater.

10. The tool of claim 8 further comprising a second heater coupled to said in-line heater for preheating said air or gas stream before said air or gas stream passes through said in-line heater.

11. The tool of claim 1 wherein said nozzle is adjustable toward or away from said board.

12. The tool of claim 1 wherein said tool is incorporated into an automated soldering system having a soldering station for generating a soldering wave positioned adjacent and preceding said tool in said automated soldering system and wherein said nozzle comprises a means for adjusting said nozzle toward or away from said soldering station.

13. The tool of claim 1 wherein said nozzle is rotatable.

14. The tool of claim 1 wherein said nozzle has an orifice from which said air or gas stream is emitted at a temperature below the temperature of molten solder at said orifice.

15. The tool of claim 1 wherein said nozzle has an orifice from which said air or gas stream is emitted at a temperature in the range of 21°–180° C. for a 63/37 tin/lead solder alloy.

16. The tool of claim 1 wherein said nozzle has an orifice from which said air or gas stream is emitted at a temperature at or above the temperature of molten solder at said orifice.

17. The tool of claim 1 wherein said nozzle has an orifice from which said air or gas stream is emitted at a flow rate from 0.1–10 $m^3$/hr.

18. A debridging tool for debridging at least a first surface area of a printed circuit board, said debridging tool comprising
    a plurality of nozzles,
    a source of pressurized air or gas coupled to said plurality of nozzles to provide an air or gas stream to be emitted onto said printed circuit board, and
    means for transporting said plurality of nozzles.

19. The debridging tool of claim 18 wherein a first nozzle of said plurality of nozzles may debridge said first surface area and a second nozzle of said plurality of nozzles may simultaneously debridge a second surface area of said printed circuit board.

20. The debridging tool of claim 18 wherein each of said plurality of nozzles is independently operable.

21. The debridging tool of claim 18 wherein said means for transporting said plurality of nozzles comprises means for transporting said first and second nozzles together.

22. The debridging tool of claim 18 wherein said means for transporting said plurality of nozzles comprises first means for transporting said first nozzle and second means for transporting said second nozzle independently of said first nozzle.

23. A debridging tool for debridging a first surface area of a printed circuit board where a bridge of solder may form between joints, said debridging tool comprising a nozzle, said nozzle comprising an orifice positioned lengthwise substantially along a first direction in which said printed circuit board travels,
    a source of pressurized air or gas coupled to said nozzle to provide an air or gas stream to be emitted from said orifice onto said bridge on said printed circuit board for removing said bridge, and
    means for transporting said nozzle automatically to said first surface area of said printed circuit board for removing solder from said first surface area, wherein said first surface area comprises only a portion of an entire surface area of said printed circuit board.

24. The debridging tool of claim 23 wherein said orifice is substantially equidistant from said board along a length of said orifice.

25. The debridging tool of claim 23 wherein said nozzle is trapezoidally-shaped.

26. The debridging tool of claim 23 wherein said nozzle is rectangularly-shaped.

27. A debridging tool for debridging a first surface area of a printed circuit board where a bridge of solder may form between joints, said debridging tool comprising
    a nozzle which is rotatable about at least one of an axis comprising a substantially vertical axis and an axis comprising a substantially horizontal axis,
    a source of pressurized air or gas coupled to said nozzle to provide an air or gas stream to be emitted from said nozzle onto said bridge on said printed circuit board for removing said bridge, and
    means for transporting said nozzle automatically to said first surface area of said printed circuit board for removing solder from said first surface area, wherein said first surface area comprises only a portion of an entire surface area of said printed circuit board.

28. The debridging tool of claim 27 wherein said nozzle is rotatable around said substantially vertical axis from a first position to a second position thereby providing a pitch degree of freedom.

29. The debridging tool of claim 28 wherein said nozzle is rotatable about said substantially horizontal axis from a first position to a second position thereby providing a roll degree of freedom.

* * * * *